United States Patent
Ryabinin et al.

(10) Patent No.: US 9,886,342 B2
(45) Date of Patent: Feb. 6, 2018

(54) STORAGE DEVICE OPERATIONS BASED ON BIT ERROR RATE (BER) ESTIMATE

(71) Applicant: SANDISK TECHNOLOGIES INC., Plano, TX (US)

(72) Inventors: Yuri Ryabinin, Beer-Sheva (IL); Eran Banani, Meitar (IL); Yan Dumchin, Beer-Sheva (IL); Mark Naumenko, Beer-Sheva (IL); Alexander Mostovoy, Dublin, CA (US); Mark Fiterman, Beer-Sheva (IL)

(73) Assignee: SanDisk Technologies LLC, Plano, TX (US)

( * ) Notice: Subject to any disclaimer, the term of this patent is extended or adjusted under 35 U.S.C. 154(b) by 136 days.

(21) Appl. No.: 14/925,676

(22) Filed: Oct. 28, 2015

(65) Prior Publication Data
US 2017/0123898 A1    May 4, 2017

(51) Int. Cl.
H03M 13/00    (2006.01)
G06F 11/10    (2006.01)
(Continued)

(52) U.S. Cl.
CPC .......... *G06F 11/1068* (2013.01); *G06F 3/064* (2013.01); *G06F 3/0619* (2013.01); *G06F 3/0679* (2013.01); *G06F 11/1012* (2013.01); *G11C 29/52* (2013.01); *H03M 13/1102* (2013.01); *H03M 13/1108* (2013.01);
(Continued)

(58) Field of Classification Search
CPC .. G06F 11/1068; G06F 3/0679; G06F 3/0619; G06F 3/064; G06F 11/1048; G06F 11/07; G06F 11/073; G06F 11/076; G06F 11/0793; G06F 11/08; G11C 29/52; G11C 11/5628; G11C 29/00; G11C 11/564;
(Continued)

(56) References Cited

U.S. PATENT DOCUMENTS 8,042,029 B2    10/2011   Alrod et al.
2008/0244338 A1  10/2008  Mokhlesi et al.
(Continued)

OTHER PUBLICATIONS

Conley, et al., U.S. Appl. No. 14/563,820 entitled, "Rewritable Multibit Non-Volatile Memory with Soft Decode Optimization," filed Dec. 8, 2014, 74 pages.
(Continued)

*Primary Examiner* — Guerrier Merant
(74) *Attorney, Agent, or Firm* — Toler Law Group, PC

(57) ABSTRACT

A data storage device may include a non-volatile memory and a controller. According to a first aspect, a bit error rate (BER) estimate may be determined at a memory interface of the controller based on hard bit data from the non-volatile memory. The BER estimate may be used to determine, prior to transfer of the hard bit data to an error correction coding (ECC) decoder of the controller, whether to request transfer of soft bit data from the non-volatile memory. According to a second aspect, the ECC decoder may be instructed to initiate decoding of a codeword or sub code using a particular operating mode based on the BER estimate for the codeword or sub code. According to a third aspect, sub codes of an ECC codeword may be reordered based on BER estimates for the sub codes, and the reordered sub codes may be provided to the ECC decoder.

30 Claims, 6 Drawing Sheets

(51) Int. Cl.
*G11C 29/52* (2006.01)
*H03M 13/11* (2006.01)
*G06F 3/06* (2006.01)
*H03M 13/37* (2006.01)

(52) U.S. Cl.
CPC .... *H03M 13/1111* (2013.01); *H03M 13/3707* (2013.01); *H03M 13/3723* (2013.01); *H03M 13/612* (2013.01); *H03M 13/6325* (2013.01)

(58) Field of Classification Search
CPC ......... H03M 13/1102; H03M 13/3715; H03M 13/3738; H03M 13/612
See application file for complete search history.

(56) References Cited

U.S. PATENT DOCUMENTS

| | | | | |
|---|---|---|---|---|
| 2009/0177931 | A1* | 7/2009 | Song | G06F 11/1012 714/704 |
| 2009/0235129 | A1* | 9/2009 | Eun | G11C 11/5642 714/704 |
| 2010/0058125 | A1* | 3/2010 | Chen | G06F 11/1048 714/704 |
| 2011/0320902 | A1 | 12/2011 | Gunnam | |
| 2013/0024605 | A1* | 1/2013 | Sharon | G06F 11/1072 711/103 |
| 2013/0111309 | A1 | 5/2013 | Zhang et al. | |
| 2013/0145229 | A1* | 6/2013 | Frayer | G06F 11/1012 714/755 |
| 2013/0166988 | A1* | 6/2013 | Sharon | G06F 11/1012 714/758 |
| 2013/0198591 | A1 | 8/2013 | Kamuf et al. | |
| 2014/0153331 | A1 | 6/2014 | Jang et al. | |
| 2014/0237316 | A1 | 8/2014 | Fitzpatrick et al. | |
| 2015/0089330 | A1 | 3/2015 | Xia et al. | |
| 2015/0169406 | A1 | 6/2015 | Li et al. | |
| 2015/0188570 | A1 | 7/2015 | Kwok et al. | |
| 2015/0286528 | A1* | 10/2015 | Cai | G06F 11/1004 714/763 |
| 2016/0218740 | A1* | 7/2016 | Parthasarathy | G11C 11/5628 |
| 2016/0246603 | A1 | 8/2016 | Watanabe et al. | |
| 2017/0097859 | A1* | 4/2017 | Parthasarathy | G06F 11/073 |
| 2017/0123900 | A1 | 5/2017 | Zhao | |

OTHER PUBLICATIONS

Ravimohan, et al., "Partial Soft Bit Read", U.S. Appl. No. 14/927,088, filed Oct. 29, 2015, 38 pages.

* cited by examiner

STORAGE DEVICE OPERATIONS BASED ON BIT ERROR RATE (BER) ESTIMATE

FIELD OF THE DISCLOSURE

The present disclosure is generally related to data storage devices and more particularly to operations based on bit error rate (BER).

BACKGROUND

Storage devices enable users to store and retrieve data. For example, some storage devices include non-volatile memory to store data and a controller that coordinates access to the non-volatile memory and performs error detection/correction. Low-density parity-check (LDPC) is a type of error correction coding (ECC) mechanism that can be performed by a storage device. When bit error rate (BER) is high, the LDPC ECC engine may use a combination of soft bits and hard bits to decode data read from the non-volatile memory. Using the soft bits may improve an error correction capability of the LDPC ECC engine. However, additional sense and data transfer operations used to determine the soft bits may increase overall latency at a storage device. Moreover, when average BER is high, soft bits may be provided and used for an entire page of data, even though the BER for individual data portions (e.g., sub codes) may be low enough to perform successful decoding without the use of soft bits. Additionally, sub codes are usually processed in the same order, regardless of the individual BER, which may contribute to the latency increase.

DETAILED DESCRIPTION

Figure 1:
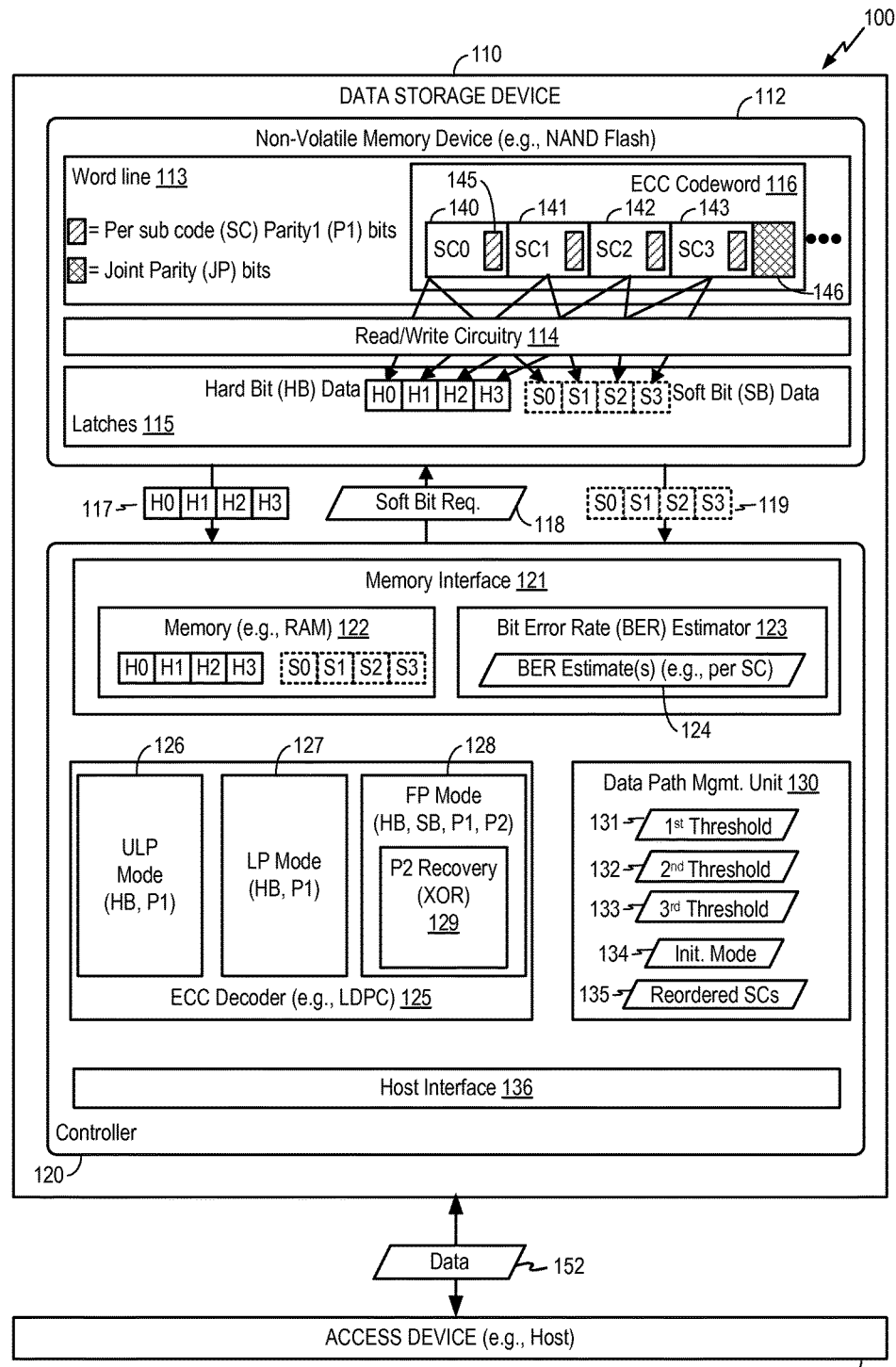
FIG. 1 is a diagram of a particular illustrative example of a system that includes a device, such as a data storage device, operable to perform one or more operations based on a bit error rate (BER) estimate.

The present disclosure describes storage device operations based on a BER estimate. A first aspect of the present disclosure involves relocating BER estimation within the controller of a storage device. To illustrate, a controller may include a memory interface configured to communicate data to and from a non-volatile memory, such as a flash memory. The controller may also include a host interface configured to communicate data to and from an access device, and an ECC decoder disposed between the flash interface and the host interface. In some examples, the controller includes a data path management unit (DPMU) coupled to the memory interface, the ECC decoder, and the host interface. For LDPC ECC decoding, the ECC decoder may include a syndrome weight calculator. Because syndrome weights may generally indicate a number of expected bit errors in a data sequence, calculating a syndrome weight can be considered a form of BER estimation. In accordance with the first aspect of the present disclosure, BER estimation, such as syndrome weight calculation, may be moved out of the ECC decoder and into the memory interface instead. For example, a BER estimator in the memory interface may compute a BER estimate on-the-fly based on hard bits received at the memory interface from the flash memory. Based on the BER estimate for received hard bits, the DPMU may determine whether or not to request soft bits from the flash memory, before either the hard bits or the soft bits are provided to the ECC decoder. Thus, in situations where the BER estimate for a codeword or sub code is low, soft bits for the codeword or sub code may not be requested, thereby reducing the overall decoding time for the codeword or sub code.

A second aspect of the present disclosure involves using a BER estimate for a codeword or sub code to select an initial ECC decoding mode for the codeword or sub code. To illustrate, an ECC decoder may support multiple modes of operation, such as an ultra-low power (ULP) mode, a low power (LP) mode, and a full power (FP) mode. Typically, the ECC decoder may always attempt to decode a received codeword/sub code in the ULP mode first. If ULP decoding is unsuccessful, the ECC decoder may try to decode the codeword/sub code in LP mode. If LP decoding is also unsuccessful, then the ECC decoder may use the FP mode. In accordance with the second aspect of the present disclosure, a BER estimate for a sub code may be used to select an initial ECC decoding mode for the codeword/sub code upfront, rather than always starting in ULP mode first and using successively higher power modes if needed. For example, the ULP, LP, or FP mode may be selected for a particular codeword/sub code based on comparing the BER estimate for the codeword/sub code to one or more thresholds. Selecting the decoding mode based on the BER estimate may improve throughput at the storage device. To illustrate, when FP mode is selected as the starting mode for a codeword/sub code with high estimated BER, decoding time for the codeword/sub code may be reduced by skipping the ULP and LP decoding attempts, which would likely be unsuccessful.

A third aspect of the present disclosure involves modifying the order in which sub codes of an ECC codeword are decoded. To illustrate, the sub codes of an ECC codeword may typically be decoded in sequential order. In some cases, however, it may be beneficial to decode the sub codes in a different order. For example, consider an ECC codeword having four sub codes. There may be three sets of parity bits computed and/or stored in a flash memory for the ECC codeword. Each sub code of the ECC codeword may be used to calculate first parity ("Parity 1") bits and second parity ("Parity 2") bits. The Parity 2 bits of each sub code may also be used to calculate joint parity bits for the ECC codeword. The Parity 1 bits and the joint parity bits may be stored in (or alongside) the ECC codeword in the flash memory, but the Parity 2 bits may not be stored in the flash memory. The ULP and LP decoding modes of an ECC decoder may attempt to decode a sub code using the Parity 1 bits for the sub code. In FP mode, the ECC decoder may attempt to recover the Parity 2 bits for the sub code (which were not stored in the flash memory), which may be a time-consuming operation. However, the joint parity bits stored in the flash memory may be calculated such that if three of the four sub codes of the ECC codeword are already decoded, the Parity 2 bits of the remaining sub code can be computed using a relatively computationally inexpensive Boolean exclusive-or (XOR) operation involving the joint parity bits. Thus, in accordance with the third aspect of the present disclosure, the decoding order of the sub codes of an ECC codeword may be determined based on respective BER estimates of the sub codes. For example, a sub code having a high estimated BER (and therefore being likely to require FP decoding using Parity 2 bits) may be reordered such that the sub code will be decoded last. Reordering in such fashion may enable the ECC decoder to reconstruct the Parity 2 bits of the last sub code using the XOR operation after the other three sub codes have already been decoded, which may be faster than using the time-consuming FP Parity 2 recovery operation.

Although various aspects of the present disclosure may be described or illustrated individually, it is to be understood that one or more aspects of the present disclosure may be combined. For example, a data storage device according to the present disclosure may be capable of operating in accordance with one, two, or all three of the aspects described above.

Particular aspects of the disclosure are described below with reference to the drawings. In the description, common or similar features or components may be designated by common reference numbers. As used herein, "exemplary" may indicate an example, an implementation, and/or an aspect, and should not be construed as indicating a preference or a preferred implementation.

Referring to FIG. 1, a particular illustrative example of a system is depicted and generally designated 100. The system 100 includes a data storage device 110 and an access device 150 (e.g., a host device, a test device, a computing device, or a combination thereof). The data storage device 110 and the access device 150 may be operationally coupled via a connection, such as a peripheral component interconnect (PCI) bus compliant with a PCI Express (PCIe) specification. In some implementations, the data storage device 110 corresponds to or includes a solid state drive (SSD) data storage device that is configured to be embedded within the access device 150 or a removable flash memory data storage device that is configured to be removably coupled to the access device 150. In other implementations, the data storage device 110 corresponds to another device, such as an application-specific integrated circuit (ASIC) or a system-on-chip (SoC) device, as illustrative non-limiting examples.

In some implementations, the system 100, the data storage device 110, one or more components of the data storage device 110, such as a memory device 112, or a combination thereof, may be integrated within a network-accessible data storage system. Examples of network-accessible data storage systems include an enterprise data system, a network-attached storage (NAS) system, or a cloud data storage system, as illustrative examples.

The access device 150 may be configured to provide data to be stored at the memory device 112 (e.g., as part of a write command) and to request data to be read from the memory device 112 (e.g., as part of a read command) In an illustrative embodiment, the access device 150 may include a mobile telephone, a music player, a video player, a gaming console, an electronic book reader, a personal digital assistant (PDA), a computer (e.g., a laptop computer, a desktop computer, a tablet computer, etc.), another electronic device, or any combination thereof.

In some examples, the memory device 112 may be a non-volatile memory device. To illustrate, the memory device 112 may include a flash memory (e.g., a NAND flash memory) or a resistive memory, such as a resistive random access memory (ReRAM), as illustrative examples. In some examples, the memory device 112 may have a three-dimensional (3D) memory configuration. As used herein, a 3D memory device may include multiple physical levels of storage elements (instead of having a single physical level of storage elements, as in a planar memory device). As an example, the memory device 112 may have a 3D vertical bit line (VBL) configuration. In a particular implementation, the memory device 112 is a non-volatile memory having a 3D memory array configuration that is monolithically formed in one or more physical levels of arrays of memory cells having an active area disposed above a silicon substrate. Alternatively, the memory device 112 may have another configuration, such as a two-dimensional (2D) memory configuration or a non-monolithic 3D memory configuration (e.g., a stacked die 3D memory configuration).

In some examples, the memory device 112 includes multiple memory dies. In such examples, when data is stored in the memory device 112, the data may be "striped" across one or more of the memory dies. Similarly, reading such data may include accessing one or more of the memory dies. In a particular aspect, the memory device 112 may include storage cells that are arranged in a plurality of word lines. Each word line, such as an illustrative word line 113 in FIG. 1, may be present on a single die or may span multiple dies of the memory device 112. The word line 113 may store a plurality of ECC codewords, which may alternatively be referred to as an ECC block. In a particular aspect, an ECC codeword may include header information, seed information, data, flags, cyclic redundancy check (CRC) or parity information, or any combination thereof. In a particular example, an ECC codeword may be 2 kilobytes (KB) or 4 KB in length, and may be divided into multiple sub codes (SCs). In FIG. 1, an illustrative ECC codeword 116 is divided into four sub codes (designated SC0 140, SC1 141, SC2 142, and SC3 143), each of which may be 512 bytes or 1 KB in length. In alternative examples, ECC codewords may be divided into a different number of sub codes, sub codes may have different lengths, or both.

Figure 2:
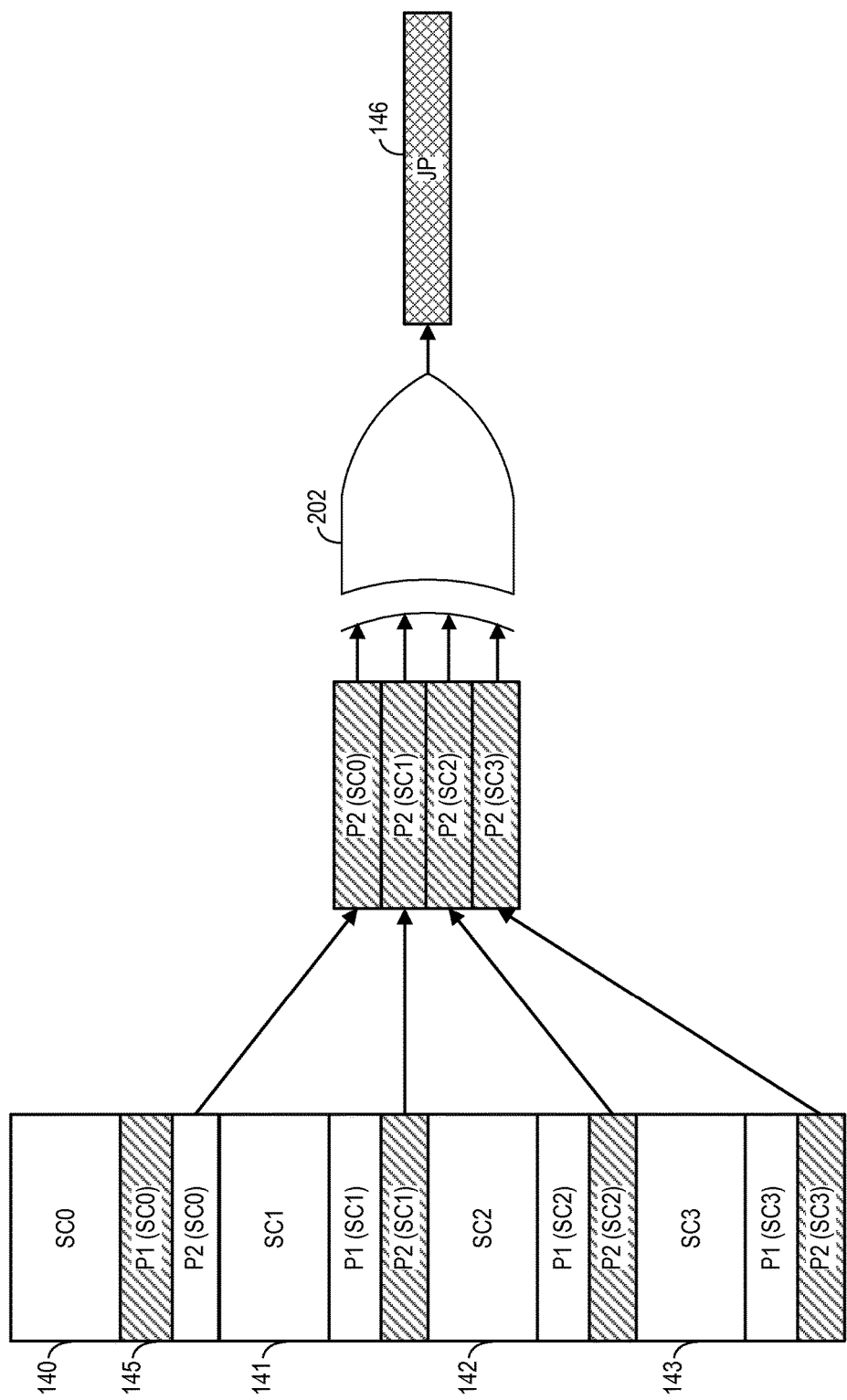
FIG. 2 is a diagram of a particular illustrative example of calculating parity bits.

In a particular aspect, the sub codes 140-143 of the ECC codeword 116 may be used to calculate various sets of parity bits, which may or may not be stored in the memory device 112. For example, as shown in FIGS. 1-2, each of the sub codes 140-143 may be used to calculate a first set of parity bits (Parity 1 (P1) bits) and a second set of parity bits (Parity 2 (P2) bits). The P1 bits for each sub code 140-143 may be stored in the memory device 112 (e.g., the P1 bits 145 for SC 0 140), but the P2 bits may not be stored in the memory device 112. The P2 bits of the sub codes 140-143 may be used to determine joint parity (JP) bits 146 for the ECC codeword 116, and the JP bits 146 may be stored in the memory device 112, as shown. In the example of FIG. 2, the JP bits 146 are determined based on an XOR operation 202 on the P2 bits, although it is to be understood that in alternative examples one or more other logical operations may be used instead.

The memory device 112 may also include read/write circuitry 114 and latches 115. In some examples, read/write circuitry 114 and latches 115 are provided around the memory device 112 in symmetrical fashion (e.g., on opposite sides of a memory array), so that densities of access lines and circuitry on each side can be reduced (e.g., by half). Alternatively, the read/write circuitry 114 and latches 115 can be laid out in non-symmetric fashion with respect to the memory device 112, as shown in FIG. 1. According to a particular aspect, the read/write circuitry 114 includes multiple sense blocks to enable a page of storage elements (e.g., memory cells) to be read or written in parallel based on row/column addressing. In one example, each storage element (e.g., memory cell) stores one bit of data for an upper page, one bit of data for a middle page, and one bit of data for a lower page.

During a read operation, the read/write circuitry 114 may sense data values stored in memory cells of one or more word lines based on a comparison to one or more sense thresholds. For example, hard bit data may be sensed using state thresholds (e.g., erase state, A state, B state, etc.) and soft bit data may be sensed using "delta" thresholds that correspond to the state thresholds plus or minus an offset value. The sensed data values for each cell of a word line, such as the word line 113, may be stored in the latches 115. In the example shown in FIG. 1, hard bit data for each of the four sub codes has been stored in the latches 115, and is designated H0, H1, H2, and H3. Soft bit data for each of the four sub codes, designated S0, S1, S2, and S3, may also be stored in the latches 115 during certain operations, as further described herein.

The data storage device 110 may include a controller 120 coupled to the memory device 112. In some implementations, the controller 120 corresponds to a semiconductor die (distinct from semiconductor die(s) of the memory device 112) that includes components of the controller 120. In the example of FIG. 1, the controller 120 includes a memory interface 121 (e.g., a flash memory interface), an ECC decoder 125, and a host interface 136. The controller 120 also includes a data path management unit (DPMU) 130 configured to control the overall flow of data and sequence of operations at the controller 120.

In a particular aspect, the host interface 136 supports communication in accordance with a non-volatile memory express (NVMe) protocol. In some examples, the data storage device 110 may include or correspond to a solid-state drive (SSD) that is accessible via NVMe protocol(s). The host interface 136 interface may facilitate transfer for data, control signals, timing signals, and/or power transfer between the access device 150 and the data storage device 110.

The memory interface 121 includes a memory 122. In an illustrative example, the memory 122 is a random access memory (RAM) that is configured to communicate with the latches 115 of the memory device 112 via a bus. In some aspects, the bus may have a toggle mode frequency that represents how often data from the latches 115 is (or can be) transferred to the memory 122 via the bus. In a particular aspect, the memory 122 at least temporarily stores data that is received from the latches 115. For example, as shown in FIG. 1, the memory 122 may at least temporarily store the hard bit data H0-H3, the soft bit data S0-S3, or both.

The ECC decoder 125 may, in some examples, correspond to a LDPC decoding engine that is configured to decode data read from the memory device 112 based on LDPC decoding principles. To illustrate, during a read operation, the ECC decoder 125 may configured to decode data stored in the word line 113 based on hard bit (HB) data (e.g., one or more hard bits sensed from the word line 113), soft bit (SB) data (e.g., one or more soft bits sensed from the word line 113), or both. The ECC decoder 125 may be configured to operate in multiple modes. To illustrate, the ECC decoder 125 may support decoding operations in an ultra-low power (ULP) mode 126, a low-power (LP) mode 127, and a full power (FP) mode 128. The ECC decoder 125 may be configured to decode sub codes individually, i.e., a "sub code" may correspond to a decoding granularity of the ECC decoder 125. In the example of FIG. 1, using the ULP mode 126 to decode a sub code includes using hard bit (HB) data and P1 bits for the sub code. Similarly, using the LP mode 127 to decode a sub code includes using HB data and P1 bits for the sub code. In some examples, the LP mode 127 and the ULP mode 126 differ in terms of the operations, or the complexity of such operations, that are performed using the HB data and the P1 bits.

Using the FP 128 mode to decode a sub code may include using one or more of P1 bits, P2 bits, HB data, or soft bit (SB) data for the sub code. As further described herein, decoding operations at the ECC decoder 125 for a particular sub code may be based at least in part on a syndrome weight for the sub code, where the syndrome weight estimates a number of bit errors likely to be present in the sub code. Completion of decoding operations at the ECC decoder 125 may result in generation of error-corrected data, which may, in some examples, be provided to the access device 150 via the host interface 136 (e.g., as illustrated by data 152 in FIG. 1).

The present disclosure enables several operations based on bit error rate (BER) estimates. According to a first aspect of the present disclosure, the memory interface 121 includes a BER estimator 123, which may determine BER estimate(s) 124 for data that is read from the memory device 112. In an illustrative example, the BER estimator 123 is configured to determine a BER estimate 124 for an individual sub code, ECC codeword, or word line. To illustrate, during operation at the data storage device 110, the memory interface 121 may receive the HB data H0-H3 117 corresponding to the sub codes 140-143 of the ECC codeword 116. The BER estimator 123 may determine a BER estimate 124 for each of the four sub codes 140-143 based on the corresponding hard bits. The BER estimates 124 for the sub codes may be determined "on-the-fly" based on the hard bits as the hard bits are received, and prior to the hard bits being provided to the ECC decoder 125 for decoding. In some examples, the BER estimate 124 for a sub code corresponds to, or is based on, a syndrome weight. Thus, according to the first aspect of the present disclosure, syndrome weight calculation may be performed in the memory interface 121 instead of (or in addition to) in the ECC decoder 125. The calculated syndrome weight (e.g., the BER estimate 124) for a sub code may be provided to the ECC decoder 125 along with the sub code (e.g., hard bits and/or soft bits for the sub code).

In a particular implementation, a syndrome weight may be calculated based on the formulas:

$$\overline{S} = \begin{bmatrix} s_0 \\ \vdots \\ s_{p-1} \end{bmatrix} = H\overline{V} = \begin{bmatrix} h_{0,0} & \cdots & h_{n-1,0} \\ \vdots & \ddots & \vdots \\ h_{0,p-1} & \cdots & h_{n-1,p-1} \end{bmatrix} \begin{bmatrix} v_0 \\ \vdots \\ v_{n-1} \end{bmatrix}$$

and $$SW = \sum_{i=0}^{i=p-1} s_i$$

where S-bar is a syndrome vector, H is a parity check matrix of a code having codeword length n, including k data bits and p parity bits (n=k+p), V-bar corresponds to vectors of data received from the memory device 112, and SW is the syndrome weight.

The BER estimate 124 (e.g., syndrome weight) for a sub code may be used to determine whether to request soft bits for the sub code. For example, the DPMU 130 may store or have access to multiple thresholds, such as an illustrative first threshold 131, second threshold 132, and third threshold 133. The DPMU 130 may determine, based on a comparison of the BER estimate 124 for a sub code to one or more of the thresholds 131-133, whether a soft bit request 118 should be sent to the memory device 112 to request soft bits for the sub code. In response to the soft bit request 118, the memory device 112 may provide the soft bits for the sub code, such as soft bit data 119.

The DPMU 130 may provide hard bit data and soft bit data to the ECC decoder 125 for decoding. In a particular aspect, the DPMU 130 determines whether the soft bit request 118 should be sent for a particular sub code (or ECC codeword, word line, etc.) prior to the hard bit data or the soft bit data for the particular sub code (or ECC codeword, word line, etc.) being provided to the ECC decoder 125. Inclusion of the BER estimator 123 in the memory interface 121 may thus enable requesting soft bit data on an as-needed basis, which may reduce data traffic on the bus between the controller 120 and the memory device 112. To illustrate, if the BER estimate 124 for a codeword or sub code does not exceed a threshold (e.g., the third threshold 133), the ECC decoder 125 may perform error correction for the codeword or sub code based on the hard bits (and not soft bits) for the codeword or sub code. Alternatively, if the BER estimate 124 for the codeword or sub code exceeds the threshold (e.g., the third threshold 133), the DPMU 130 may request soft bits for the codeword or sub code using the request 118, and the ECC decoder 125 may perform error correction for the codeword or sub code based on both the hard bits and the soft bits for the codeword or sub code.

Figure 3:
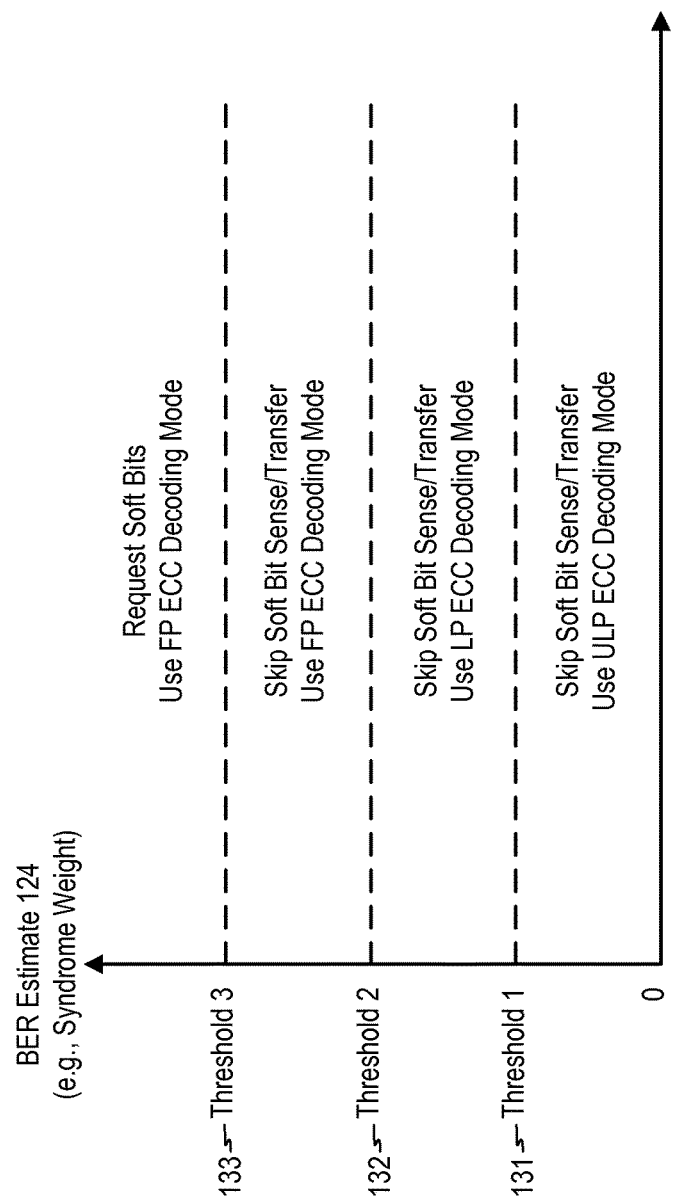
FIG. 3 is a diagram of a particular illustrative example of comparing a BER estimate to one or more thresholds.

According to a second aspect of the disclosure. The DPMU 130 may use the BER estimate 124 for a codeword or sub code to select an initial decoding mode 134 of the ECC decoder 125 for the codeword or sub code, and may instruct the ECC decoder 125 to initiate decoding of the codeword or sub code in the initial decoding mode 134. For example, the DPMU 130 may compare the BER estimate 124 for the codeword or sub code to one or more of the thresholds 131-133, as shown in FIG. 3. When the BER estimate 124 for a codeword or sub code is less than the first threshold 131, the DPMU 130 may skip transfer of soft bit data for the codeword or sub code (e.g., the request 118 may not be sent) and may select the ULP mode 126 as the initial decoding mode 134. The ECC decoder 125 may initiate decoding of the codeword or sub code in the ULP mode 126 using the hard bit data for the codeword or sub code. The ULP mode 126 may be selected for codewords or sub codes having low BER, because of the high likelihood that the ULP mode 126 is sufficient to decode such codewords or sub codes without requesting soft bit data.

When the BER estimate 124 for a codeword or sub code is greater than or equal to the first threshold 131 and less than the second threshold 132, the DPMU 130 may skip transfer of soft bit data for the codeword or sub code and may select the LP mode 127 as the initial decoding mode 134. The ECC decoder 125 may initiate decoding of the codeword or sub code in the LP mode 127 using the hard bit data for the codeword or sub code.

When the BER estimate 124 for a sub code is greater than or equal to the second threshold 132 and less than the third threshold 133, the DPMU 130 may skip transfer of soft bit data for the codeword or sub code and may select the FP mode 128 as the initial decoding mode 134. The ECC decoder 125 may initiate decoding of the codeword or sub code in the FP mode 128 using the hard bit data for the codeword or sub code.

When the BER estimate 124 is greater than or equal to the third threshold 133, the DPMU 130 may request soft bit data for the codeword or sub code (e.g., via the request 118) and may select the FP mode 128 as the initial decoding mode 134. The ECC decoder 125 may initiate decoding of the codeword or sub code in the FP mode 126 using both the hard bit data and the soft bit data for the codeword or sub code.

In particular implementations, two bits per codeword or sub code may be used to indicate the value of the initial decoding mode 134 of the codeword or sub code. The indication of the initial decoding mode may be provided to the ECC decoder 125 by the DPMU 130 (e.g., as a descriptor in a command or instruction) or may be provided by the memory interface 121 along with transfer of hard bits and/or soft bits to the ECC decoder. It should therefore be understood that although various operations may be described herein as being performed by the DPMU 130, one or more of the described operations may instead be performed by the memory interface 121. Using the BER estimate 124 for a codeword or sub code to determine the initial decoding mode 134 for the codeword or sub code may save energy and reduce decoding latency at the data storage device 110. To illustrate, soft bit data may not be requested unless the BER estimate is high. Further, ULP or both ULP and LP decoding operations may skipped when the BER estimate is high.

According to a third aspect of the present disclosure, the BER estimates 124 for the sub codes (e.g., the sub codes 140-143) of an ECC codeword (e.g., the ECC codeword 116) may be used to determine that the sub codes should be decoded by the ECC decoder 125 in non-sequential order. As explained above, the ULP mode 126 and the LP mode 127 may use P1 bits during decoding, whereas the FP mode 128 may use P2 bits instead of or in addition to P1 bits. Because P2 bits for a sub code may not be stored in the memory device 112, if FP decoding using P1 bits fails, the ECC decoder 125 may recover the P2 bits for the sub code. When a sub code is decoded successfully, its P2 bits may be generated via a relatively simple encoding operation. In addition, the JP bits for the ECC codeword may be implemented such that, if at least a certain number of sub codes (e.g., three sub codes) of the ECC codeword have been successfully decoded, the P2 bits for the remaining undecoded sub code(s) (e.g., a fourth sub code) may be reconstructed using a Boolean XOR operation, the JP bits, and the P2 bits of the decoded sub codes.

Thus, if the BER estimates 124 for the sub codes (e.g., the sub codes 140-143) of an ECC codeword (116) indicate that a particular sub code should be decoded in the FP mode 128 but the remaining sub codes can be decoded in the ULP mode 126 or in the LP mode 127, the particular sub code may be decoded last by the ECC decoder 125.

Figure 4:
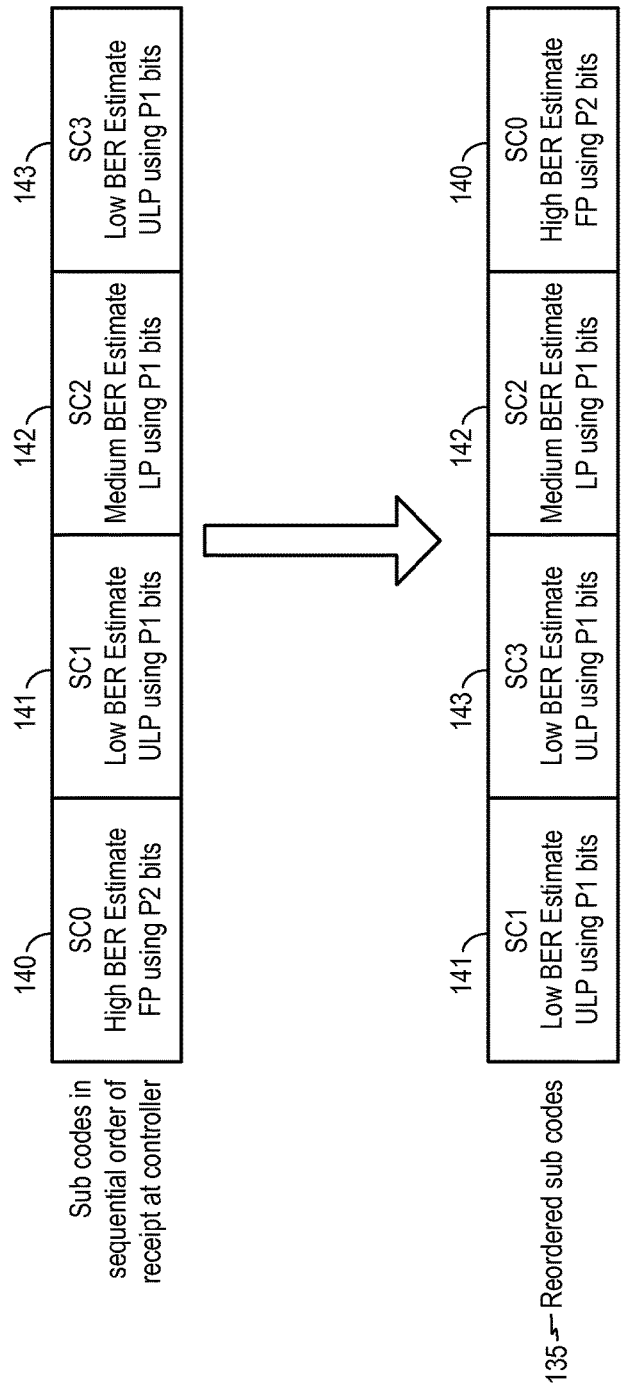
FIG. 4 is a diagram of a particular illustrative example of reordering sub codes based on BER estimates.

For example, as shown in FIG. 4, the DPMU 130 may reorder the sub codes 140-143 such that the sub codes 140-143 are in order of increasing BER estimate 124. The DPMU 130 may provide the reordered sub codes 135 to the ECC decoder 125 for decoding (or may instruct the memory interface 121 to provide hard bits and/or soft bits to the ECC decoder 125 according to the reordering). The sub codes having low and medium BER may be decoded first using their P1 bits. The P2 bits for the decoded sub codes may be available when decoding of the last (high BER) sub code begins, so that if P2 bits for the last sub code are needed, the P2 bits for the last sub code can be recovered using a XOR operation based on the JP bits 146 and the P2 bits of the decoded sub codes. Such recovery of P2 bits using a XOR operation is illustrated in FIG. 1 as a P2 recovery operation 129. After the P2 bits for the last sub code are recovered, the ECC decoder 125 may decode the last sub code using its P1 bits and the recovered P2 bits. Using the XOR-based recovery operation for a sub code may decrease decoding latency as compared to conventional P2 recovery techniques, which may involve zeroing out the P2 bits and running FP decoding operations.

The system 100 of FIG. 1 thus illustrates various operations based on BER estimates. Use of one or more of the operations may reduce energy consumption, improve decoding latency, and increase throughput at the data storage device 110. Although various aspects, such as the first, second, and third aspects described with reference to FIG. 1 may be illustrated individually, it is to be understood that one or more aspects of the present disclosure may be combined. For example, during execution of a read command at the data storage device 110, the BER estimate 124 for a codeword or sub code may be used to determine whether to request soft bits for the codeword or sub code. Hard bits and soft bits (if requested) for the codeword or sub code may be provided to the ECC decoder along with an indication of the initial decoding mode 134 for the codeword or sub code, where the hard bits and soft bits (if requested) are reordered based on the BER estimates 124 so that a codeword or sub code that is likely to require FP mode decoding will be decoded last.

Although various aspects may be described herein as operating on a sub code basis or on a codeword basis, such descriptions are for illustration only, and are not to be considered limiting. Techniques and aspects of the present disclosure may be used in conjunction with data storage designs that are not codeword-based or sub code-based. For example, an "early" BER estimate (e.g., determined at a memory interface or other component external to an ECC decoder) may be used to determine whether or not to request soft bits for a portion of data other than a codeword or sub code. As another example, a BER estimate may be used to determine an initial decoding mode for a portion of data other than a codeword or sub code. As yet another example, portions of data other than sub codes (whose parity bits are mathematically related) may be reordered based on BER estimates.

Figure 5:
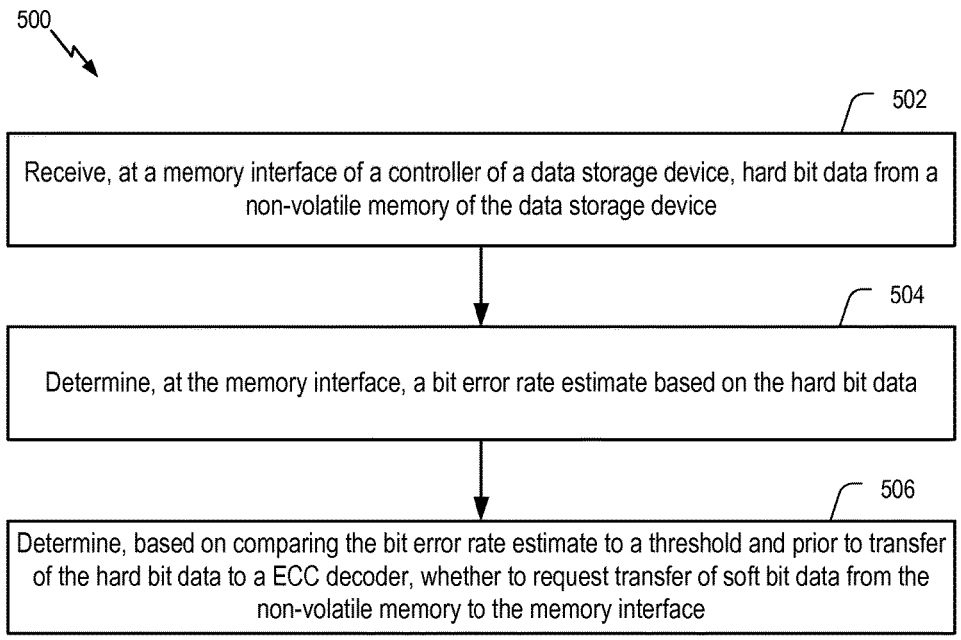
FIG. 5 is a flowchart of a particular illustrative example of a method of operation at the system of FIG. 1.

Referring to FIG. 5, an illustrative example of a method 500 of operation is shown. The method 500 may be performed at a data storage device that includes a controller coupled to a non-volatile memory, the controller including an error correction coding (ECC) decoder. In a particular aspect, the method 500 may be performed at the data storage device 110 of FIG. 1.

The method 500 may include receiving, at a memory interface of the controller, hard bit data from the non-volatile memory device, at 502. For example, the hard bit data may correspond to hard bits read from non-volatile memory device 112 of FIG. 1 that correspond to one or more of the sub codes 140-143 of the ECC codeword 116 of FIG. 1.

The method 500 may include determining, at the memory interface, a bit error rate estimate based on the hard bit data, at 504. The bit error rate estimate may correspond to a syndrome weight calculated based on the hard bit data. For example, the bit error rate estimate may correspond to the BER estimate 124 that is determined by the BER estimator 123 of FIG. 1.

The method 500 may include determining, based on comparing the bit error rate estimate to a threshold and prior to transfer of the hard bit data to the ECC decoder, whether to request transfer of soft bit data from the non-volatile memory to the memory interface, at 506. For example, prior to the hard bit data being provided to the ECC decoder 125 of FIG. 1, the memory interface 121 or the DPMU 130 may compare the BER estimate 124 to a threshold (e.g., the third threshold 133) to determine whether to send the soft bit request 118 to request transfer of soft bit data.

In some implementations, the method 500 may also include providing the hard bit data, the soft bit data, or both, to the ECC decoder. For example, the method 500 may include generating error corrected data at the ECC decoder based on the hard bit data, the soft bit data, or both. The method 500 may further include sending the error corrected data to an access device, such as the access device 150 of FIG. 1, via a host interface of the controller, such as the host interface 136 of the controller 120 of FIG. 1.

By determining the BER estimate at the memory interface, a determination of whether to request soft bits may be performed prior to an initial decoding of the hard bits. As a result, soft bits may be requested and received from the non-volatile memory when a relatively high bit error rate estimate indicates that ECC decoding latency may be reduced using the soft bits so that the hard bits and the soft bits are available to the ECC decoder for the initial decoding of the data. Thus, ECC decoding with soft bits may be performed with reduced latency as compared to systems that do not request soft bit information until after initial decoding of the hard bits has begun.

Figure 6:
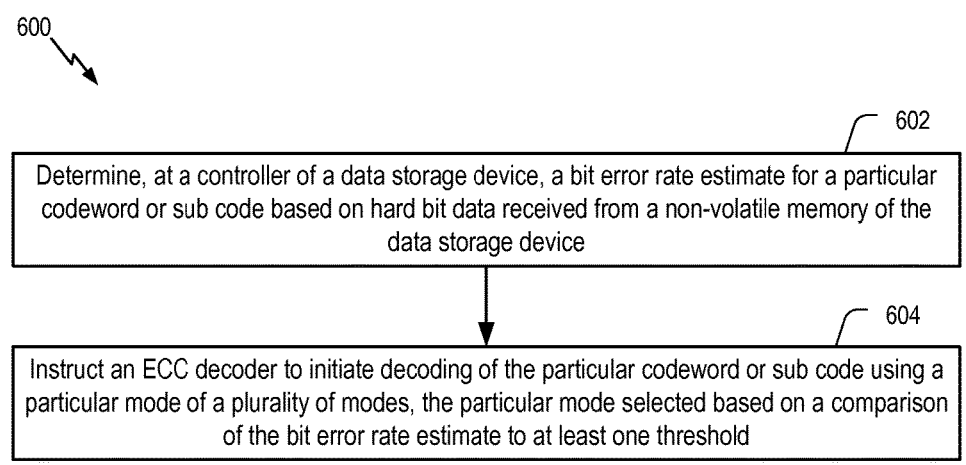
FIG. 6 is a flowchart of another particular illustrative example of a method of operation at the system of FIG. 1.

Referring to FIG. 6, an illustrative example of a method 600 of operation is shown. The method 600 may be performed at a data storage device that includes a controller coupled to a non-volatile memory, the controller including an error correction coding (ECC) decoder configured to operate in a plurality of modes. In a particular aspect, the method 600 may be performed at the data storage device 110 of FIG. 1.

The method 600 may include determining, at the controller, a bit error rate estimate for a particular codeword or sub code based on hard bit data received from the non-volatile memory device, at 602. For example, the bit error rate estimate may be the BER estimate 124 determined by the BER estimator 123 at the memory interface 121 of FIG. 1. In other implementations, the bit error rate estimate may be determined at one or more other components of the controller, such as at the ECC decoder 125 or another component of the controller 120 of FIG. 1.

The method 600 may include instructing the ECC decoder to initiate decoding of the particular codeword or sub code using a particular mode of the plurality of modes, at 604. The particular mode is selected based on a comparison of the bit error rate estimate to at least one threshold. For example, the DPMU 130 of FIG. 1 may compare the BER estimate 124 to one or more of the thresholds 131-133 to determine the initial decoding mode 134.

As an illustrative example, when the bit error rate estimate is less than a first threshold, the method 600 may include skipping transfer of soft bit data for the particular codeword or sub code from the non-volatile memory and selecting a ULP mode of the plurality of modes as the particular mode. For example, in response to the BER estimate 124 being less than the first threshold 131, the DPMU 130 may generate a control signal to cause the ECC decoder 125 to decode hard bits of the particular codeword or sub code according to the ULP mode 126 of FIG. 1.

When the bit error rate estimate is greater than or equal to the first threshold and less than a second threshold, the method 600 may include skipping the transfer of the soft bit data for the particular codeword or sub code from the non-volatile memory and selecting a LP mode as the particular mode. For example, in response to the BER estimate 124 being greater than or equal to the first threshold 131 and less than the second threshold 132, the DPMU 130 may generate a control signal to cause the ECC decoder 125 to decode hard bits of the particular codeword or sub code according to the LP mode 127 of FIG. 1.

When the bit error rate estimate is greater than or equal to the second threshold and less than a third threshold, the method 600 may include skipping the transfer of the soft bit data for the particular codeword or sub code from the non-volatile memory and selecting a FP mode of the plurality of modes as the particular mode. For example, in response to the BER estimate 124 being greater than or equal to the second threshold 132 and less than the third threshold 133, the DPMU 130 may generate a control signal to cause the ECC decoder 125 to decode hard bits of the particular codeword or sub code according to the FP mode 128 of FIG. 1.

When the bit error rate estimate is greater than or equal to the third threshold, the method 600 may include requesting transfer of the soft bit data for the particular codeword or sub code from the non-volatile memory and selecting the FP mode as the particular mode. For example, in response to the BER estimate 124 being greater than or equal to the third threshold 133, the DPMU 130 may request transfer of soft bit data from the memory device 112 (e.g., via the request 118) and may generate a control signal to cause the ECC decoder 125 to decode hard bits and soft bits of the particular codeword or sub code according to the FP mode 128 of FIG. 1.

By initiating decoding using an ECC mode that is selected based on the BER estimate, decoding attempts using one or more lower-power ECC decoding modes may be bypassed for data that is predicted to have a higher error rate than is correctable by the lower-power ECC decoding mode(s). As a result, an average decoding latency may be reduced as compared to systems that initiate data decoding using a lowest-power ECC mode for all data and that only progress to a higher-power ECC mode after decoding has failed in a lower-power ECC mode.

Figure 7:
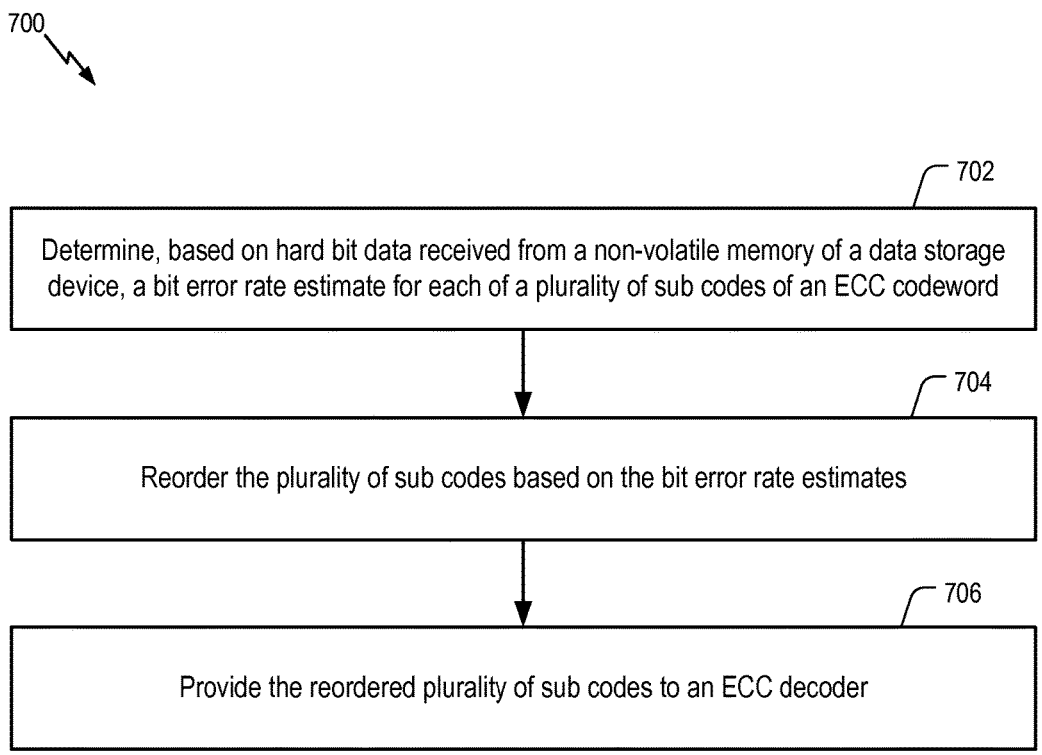
FIG. 7 is a flowchart of another particular illustrative example of a method of operation at the system of FIG. 1.

Referring to FIG. 7, an illustrative example of a method 700 of operation is shown. The method 700 may be performed at a data storage device that includes a controller coupled to a non-volatile memory, the controller including an error correction coding (ECC) decoder configured to operate in a plurality of modes. In a particular aspect, the method 700 may be performed at the data storage device 110 of FIG. 1.

The method 700 may include determining, based on hard bit data received from the non-volatile memory, a bit error rate estimate for each of a plurality of sub codes of an ECC codeword, at 702. For example, the bit error rate estimate may be the BER estimate 124 determined by the BER estimator 123 at the memory interface 121 of FIG. 1. In other implementations, the bit error rate estimate may be determined at one or more other components of the controller, such as at the ECC decoder 125 or another component of the controller 120 of FIG. 1.

The method 700 may include reordering the plurality of sub codes based on the bit error rate estimates, at 704, and providing the reordered plurality of sub codes to the ECC decoder, at 706. To illustrate, the DPMU 130 may at least partially sort the sub codes so that sub codes that are estimated to be decodable using a lower power ECC mode (e.g., the ULP mode 126 or the LP mode 127 of FIG. 1) are decoded prior to decoding any sub codes that are estimated to be undecodable using the lower power ECC mode. For example, the DPMU 130 may compare one or more of the BER estimates to one or more of the thresholds 131-133 to determine a sort order of the reordered sub codes 135. In some implementations, the sub codes may be sorted by BER and decoded in order of increasing BER to reduce an average decoding latency of the sub codes.

Sub codes that are predicted to require FP decoding that uses P2 bits may be positioned after the other sub codes in the sort order to reduce delays in generating the P2 bits. For example, the method 700 may include determining, based on a particular bit error rate estimate for a particular sub code of the plurality of sub codes, that the particular sub code is to be decoded in a full power (FP) mode of the plurality of modes (e.g., by determining that the BER estimate 124 of the sub code is greater than the third threshold 133 of FIG. 1). The particular sub code may be set as a last sub code of the reordered plurality of sub codes 135.

In implementations where each sub code of the plurality of sub codes is associated with first parity bits calculated based on the sub code, second parity bits calculated based on the sub code, and joint parity bits calculated based on the second parity bits associated with each of the plurality of sub codes, the second parity bits associated with a last sub code of the reordered plurality of sub codes may be reconstructed based on an exclusive-or (XOR) operation and the joint parity bits.

Reordering sub codes based on bit error rate estimates may reduce average decoding latency of the sub codes. For example, sub codes estimated to be more quickly decodable may be decoded before sub codes estimated to have longer decoding times to reduce delays caused by longer decoding times on a serial decoding order (e.g., due to time-consuming reconstruction of P2 bits in FP mode). By adjusting a decoding order of the sub codes to delay decoding of sub codes that may use P2 bits until after other sub codes have been decoded, delays during decoding using the P2 bits may be reduced or avoided.

In some implementations, a computer-readable medium stores instructions executable by a processing module to perform operations described herein. For example, the computer-readable medium, the processing module, or both may be included in the data storage device 110, the memory device 112, the controller 120 (or one or more components thereof), the access device 150, or any combination thereof.

Although various components depicted herein are illustrated as block components and described in general terms, such components may include one or more microprocessors, state machines, or other circuits configured to enable such components to perform one or more operations described herein. For example, components of the controller 120 may represent physical components, such as hardware controllers, state machines, logic circuits, or other structures, to enable the controller 120 to perform operations described herein.

Alternatively or in addition, one or more components described herein may be implemented using a microprocessor or microcontroller programmed to perform operations, such as one or more operations of the methods 500, 600, and 700 of FIGS. 5-7. Instructions executed by the controller 120 and/or the data storage device 110 may be retrieved from a memory, such as a RAM or a read-only memory (ROM).

In some examples, the data storage device 110 may be coupled to, attached to, or embedded within one or more accessing devices, such as within a housing of the access device 150. For example, the data storage device 110 may be embedded within the access device 150 in accordance with a Joint Electron Devices Engineering Council (JEDEC) Solid State Technology Association Universal Flash Storage (UFS) configuration. To further illustrate, the data storage device 110 may be integrated within an electronic device, such as a mobile telephone, a computer (e.g., a laptop, a tablet, or a notebook computer), a music player, a video player, a gaming device or console, a component of a vehicle (e.g., a vehicle console), an electronic book reader, a personal digital assistant (PDA), a portable navigation device, or other device that uses internal non-volatile memory.

In one or more other implementations, the data storage device 110 may be implemented in a portable device configured to be selectively coupled to one or more external devices, such as a host device. For example, the data storage device 110 may be removable from the access device 150 (i.e., "removably" coupled to the device). As an example, the data storage device 110 may be removably coupled to the access device 150 in accordance with a removable universal serial bus (USB) configuration.

In some implementations, the system 100, the data storage device 110, or a component thereof may be integrated within a network-accessible data storage system, such as an enterprise data system, an NAS system, or a cloud data storage system, as illustrative examples. In some implementations, the data storage device 110 may include a solid state drive (SSD). The data storage device 110 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the data storage device 110 may be coupled to the access device 150 via a network. For example, the network may include a data center storage system network, an enterprise storage system network, a storage area network, a cloud storage network, a local area network (LAN), a wide area network (WAN), the Internet, and/or another network.

To further illustrate, the data storage device 110 may be configured to be coupled to the access device 150 as embedded memory, such as in connection with an embedded MultiMedia Card (eMMC®) (trademark of JEDEC Solid State Technology Association, Arlington, Va.) configuration, as an illustrative example. The data storage device 110 may correspond to an eMMC device. As another example, the data storage device 110 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 110 may operate in compliance with a JEDEC industry specification. For example, the data storage device 110 may operate in compliance with a JEDEC eMMC specification, a JEDEC Universal Flash Storage (UFS) specification, one or more other specifications, or a combination thereof.

The memory 122 and/or the memory device 112 may include a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), another type of memory, or a combination thereof. In a particular embodiment, the data storage device 110 is indirectly coupled to the access device 150 via a network. For example, the data storage device 110 may be a network-attached storage (NAS) device or a component (e.g., a solid-state drive (SSD) component) of a data center storage system, an enterprise storage system, or a storage area network. The memory 122 and/or the memory device 112 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
a non-volatile memory; and
a controller including:
an error correction coding (ECC) decoder;
a memory interface coupled to the non-volatile memory and to the ECC decoder, the memory interface including a bit error rate estimator configured to determine a bit error rate estimates in a first order, based on hard bit data received from the non-volatile memory and prior to transfer of one or both of the hard bit data or sub codes to the ECC decoder; and
a data path management unit coupled to the memory interface and to the ECC decoder, the data path management unit configured to:
determine, based on the bit error rate estimates and prior to transfer of the hard bit data to the ECC decoder, whether to transfer the sub codes to the ECC decoder in another order; and
provide the sub codes to the ECC decoder based on the determination.

2. The data storage device of claim 1, wherein the bit error rate estimates corresponds to a syndrome weights.

3. The data storage device of claim 1, wherein the data path management unit is further configured to determine, based on a comparison of at least one of the bit error rate estimates to at least one threshold and prior to providing the hard bit data to the ECC decoder, whether to request transfer of soft bit data from the non-volatile memory to the memory interface.

4. The data storage device of claim 1, wherein the controller further includes a host interface coupled to the ECC decoder and configured to send error corrected data generated by the ECC decoder to an access device.

5. The data storage device of claim 1, wherein the ECC decoder comprises a low-density parity-check (LDPC) ECC decoder, wherein the non-volatile memory comprises a flash memory, and wherein the memory interface comprises a flash memory interface.

6. A method comprising:
at a data storage device that includes a controller coupled to a non-volatile memory, the controller including an error correction coding (ECC) decoder, performing:
receiving, at a memory interface of the controller, hard bit data from the non-volatile memory;
determining, at the memory interface, a bit error rate estimate for each of multiple sub codes based on the hard bit data, the bit error rate estimates determined based on a first order prior to initiating decoding of the multiple sub codes at the data storage device or prior to transfer of one or both of the hard bit data or the multiple sub codes to the ECC decoder;
determining, based on the bit error rate estimates and prior to transfer of the hard bit data to the ECC decoder, whether to provide the multiple sub codes to the ECC decoder based on another order; and
providing the multiple sub codes to the ECC decoder based on the determination.

7. The method of claim 6, wherein the bit error rate estimates corresponds to a syndrome weights calculated based on the hard bit data.

8. The method of claim 6, further comprising providing the hard bit data, soft bit data, or both to the ECC decoder.

9. The method of claim 6, further comprising generating error corrected data at the ECC decoder based on the hard bit data, soft bit data, or both.

10. The method of claim 9, further comprising;
determining, based on a comparison of at least one of the bit error rate estimates to at least one threshold and prior to transfer of the hard bit data to the ECC decoder, whether to request transfer of the soft bit data from the non-volatile memory to the memory interface; and
sending the error corrected data to an access device via a host interface of the controller.

11. A data storage device comprising:
a non-volatile memory; and
a controller including:
an error correction coding (ECC) decoder configured to operate in a plurality of modes;
a bit error rate estimator configured to determine a bit error rate estimate for a particular codeword or sub code based on hard bit data received from the non-volatile memory; and
a data path management unit, wherein:
the data path management unit is configured to provide an indication to the ECC decoder,
the indication is configured to instruct the ECC decoder to initiate decoding of a first sub code of a codeword in parallel with initiating decoding of a different sub code of the same codeword, and
the ECC decoder is further configured to decode the first sub code and the different sub code using different modes of the plurality of modes.

12. The data storage device of claim 11, wherein the data path management unit is further configured to instruct the ECC decoder to initiate decoding of the particular codeword or sub code using a particular modes of the plurality of modes, the particular mode selected based on a comparison of the bit error rate estimate to at least one threshold.

13. The data storage device of claim 11, wherein the plurality of modes includes an ultra-low power (ULP) mode, a low power (LP) mode, and a full power (FP) mode.

14. The data storage device of claim 11, wherein the data path management unit is further configured to determine whether to request transfer of soft bit data from the non-volatile memory based at least in part on the a comparison of the bit error rate estimate to at least one threshold.

15. The data storage device of claim 11, wherein the bit error rate estimates corresponds to a syndrome weights.

16. The method of claim 6, wherein the ECC decoder is configured to operate in a plurality of modes, and further comprising:
determining, at the controller, an error rate estimate for a particular codeword or sub code based on particular hard bit data received from the non-volatile memory; and
instructing the ECC decoder to initiate decoding of the particular codeword or sub code using a particular mode of the plurality of modes, the particular mode selected based on a comparison of the error rate estimate to at least one threshold.

17. The method of claim 16, further comprising, when the error rate estimate is less than a first threshold, skipping transfer of soft bit data for the particular codeword or sub code from the non-volatile memory and selecting an ultra-low power (ULP) mode of the plurality of modes as the particular mode.

18. The method of claim 17, further comprising, when the error rate estimate is greater than or equal to the first threshold and less than a second threshold, skipping the transfer of the soft bit data for the particular codeword or sub code from the non-volatile memory and selecting a low power (LP) mode of the plurality of modes as the particular mode.

19. The method of claim 18, further comprising, when the error rate estimate is greater than or equal to the second threshold and less than a third threshold, skipping the transfer of the soft bit data for the particular codeword or sub code from the non-volatile memory and selecting a full power (FP) mode of the plurality of modes as the particular mode.

20. The method of claim 19, further comprising, when the error rate estimate is greater than or equal to the third threshold, requesting transfer of the soft bit data for the particular codeword or sub code from the non-volatile memory and selecting the FP mode of the plurality of modes as the particular mode.

21. A data storage device comprising:
a non-volatile memory; and
a controller including:
an error correction coding (ECC) decoder configured to operate in a plurality of modes;
a bit error rate estimator configured to determine, based on hard bit data received from the non-volatile memory, a bit error rate estimate for each of a plurality of sub codes of an ECC codeword, the bit error rate estimates determined based on an order prior to provision of one or both of the hard bit data or the plurality of sub codes to the ECC decoder; and
a data path management unit configured to:
reorder the plurality of sub codes based on the bit error rate estimates; and
provide the reordered plurality of sub codes to the ECC decoder.

22. The data storage device of claim 21, wherein each sub code of the plurality of sub codes is associated with first parity bits computed based on the sub code, second parity bits computed based on the sub code, and joint parity bits computed based on the second parity bits associated with each of the plurality of sub codes.

23. The data storage device comprising:
a non-volatile memory; and
a controller including:
an error correction coding (ECC) decoder configured to operate in a plurality of modes;
a bit error rate estimator configured to determine, based on hard bit data received from the non-volatile memory, a bit error rate estimate for each of a plurality of sub codes of an ECC codeword; and
a data path management unit configured to reorder the plurality of sub codes based on the bit error rate estimates and to provide the reordered plurality of sub codes to the ECC decoder, wherein first parity bits and joint parity bits associated with the plurality of sub codes are stored in the non-volatile memory, and wherein second parity bits associated with the plurality of sub codes are not stored in the non-volatile memory.

24. The data storage device of claim 21, wherein the bit error rate estimates corresponds to a syndrome weights.

25. The method of claim 6, wherein the ECC decoder is further configured to operate in a plurality of modes.

26. A method comprising:
determining, at a data storage device that includes a controller coupled to a non-volatile memory and based on a particular bit error rate estimate for a particular sub code of a plurality of sub codes of an error correction coding (ECC) codeword, that the particular sub code is to be decoded in a full power (FP) mode of a plurality of decoding modes;
reordering the plurality of sub codes based on the particular bit error rate estimate,
wherein reordering the plurality of sub codes includes setting the particular sub code as a last sub code of the reordered plurality of sub codes; and
providing the reordered plurality of sub codes to an ECC decoder.

27. The method of claim 26, wherein each sub code of the plurality of sub codes is associated with first parity bits calculated based on the sub code, second parity bits calculated based on the sub code, and joint parity bits calculated based on the second parity bits associated with each of the plurality of sub codes.

28. The method of claim 27, further comprising reconstructing the second parity bits associated with the last sub code of the reordered plurality of sub codes based on an exclusive-or (XOR) operation and the joint parity bits.

29. An apparatus comprising:
means for storing data; and
means for performing operations, the means for performing operations including means for providing an interface to the means for storing data and including means for decoding, the means for providing the interface configured to:
receive hard bit data from the means for storing data;
generate a bit error rate estimate for each of multiple sub codes based on the hard bit data, the bit error rate estimates determined in a first order prior to providing one or both of the hard bit data or the multiple sub codes to the means for decoding;
determine, based on the bit error rate estimates and prior to transfer of the hard bit data to the means for decoding, whether to provide the multiple sub codes to the means for decoding in another order; and
provide the multiple sub codes to the means for decoding based on the determination.

30. The apparatus of claim 29, wherein the means for providing the interface is further configured to determine, based on a comparison of at least one of the bit error rate estimates to at least one threshold and prior to providing of the hard bit data to the means for decoding, whether to request transfer of soft bit data from the means for storing data to the means for providing the interface.

* * * * *